United States Patent [19]

Sellers

[11] Patent Number: 5,661,399

[45] Date of Patent: Aug. 26, 1997

[54] DIAGNOSTIC MAGNETIC RESONANCE APPARATUS OPERABLE WITH REDUCED NOISE

[75] Inventor: Michael Sellers, Erlangen, Germany

[73] Assignee: Siemens Aktiengesellschaft, Munich, Germany

[21] Appl. No.: 622,690

[22] Filed: Mar. 26, 1996

[30] Foreign Application Priority Data

Mar. 30, 1995 [DE] Germany .................. 195 11 834.0

[51] Int. Cl.$^6$ .................................................. G01V 3/00
[52] U.S. Cl. ........................................... 324/318; 324/319
[58] Field of Search .................................. 324/318, 319, 324/320, 321; 128/653.5

[56] References Cited

U.S. PATENT DOCUMENTS

| | | | |
|---|---|---|---|
| 4,680,545 | 7/1987 | Gray et al. | 324/307 |
| 4,954,781 | 9/1990 | Hirata | 324/318 |
| 4,959,613 | 9/1990 | Yamamoto et al. | 324/318 |
| 5,012,192 | 4/1991 | Siebold | 324/318 |
| 5,083,085 | 1/1992 | Morad | 324/318 |
| 5,198,769 | 3/1993 | Frese et al. | 324/318 |
| 5,235,283 | 8/1993 | Lehne et al. | 324/318 |
| 5,332,972 | 7/1994 | Takenouchi | 324/318 |
| 5,481,191 | 1/1996 | Rzedzian | 324/318 |
| 5,545,996 | 8/1996 | Morich et al. | 324/322 |

FOREIGN PATENT DOCUMENTS

| | | |
|---|---|---|
| 0 132 338 | 1/1985 | European Pat. Off. . |
| 0 138 269 | 4/1985 | European Pat. Off. . |
| 0 431 216 | 6/1991 | European Pat. Off. . |
| 0 597 528 | 5/1994 | European Pat. Off. . |
| 0 629 875 | 12/1994 | European Pat. Off. . |
| 34 44 388 | 8/1985 | Germany . |
| 44 32 747 | 3/1995 | Germany . |

*Primary Examiner*—Louis M. Arana
*Attorney, Agent, or Firm*—Hill, Steadman & Simpson

[57] ABSTRACT

In a diagnostic nuclear magnetic resonance apparatus having a main magnetic field and gradient coils for generating gradient fields, the gradient coils including conductors that run essentially perpendicularly to the direction of the main magnetic field, compensating coils for reducing the main magnetic field present in the environment of the conductors are allocated to these conductors. By reducing the effect of the main magnetic field in regions near these conductors, oscillations of these conductors arising due to switching of the gradient current are reduced, thereby reducing bothersome noises which arise during the production of an image.

10 Claims, 2 Drawing Sheets

DIAGNOSTIC MAGNETIC RESONANCE APPARATUS OPERABLE WITH REDUCED NOISE

BACKGROUND OF THE INVENTION

1. Field of the Invention

The present invention is directed to a diagnostic nuclear magnetic resonance (magnetic resonance imaging) apparatus having a main magnetic field and gradient coils for the generation of gradient fields, the gradient coils including conductors that run essentially perpendicularly to the direction of the main magnetic field.

2. Description of the Prior Art

A diagnostic nuclear magnetic resonance device of the above general type is known from U.S. Pat. No. 4,954,781. The nuclear magnetic resonance device disclosed therein has a cylindrical examination chamber that accepts a patient to be examined. The examination chamber is surrounded by a superconducting magnet that generates a homogeneous main magnetic field in the examination chamber extending in an axial direction, i.e. the z-direction. A cylindrical carrier tube is arranged between the superconducting magnet and the examination chamber, to which gradient coils are attached for the generation of gradient fields in directions perpendicular to one another, of which one direction coincides with the direction of the main magnetic field in the z-direction. High-frequency antennas are likewise fastened to the carrier tube, by means of which nuclear spins in an examination subject are excited and the resulting nuclear magnetic resonance signals are received.

In the operation of the nuclear magnetic resonance apparatus for the generation of sectional images, the gradient fields must be switched on and off. This is achieved by supplying the gradient coils with switched currents of different amplitudes and different switching frequencies, with the direction of the currents through the gradient coils additionally being changed. This has the consequence that the conductors of the gradient coils, as well as the carrier tube, are exposed to oscillating forces that produce bothersome noises. In modern imaging sequences, particularly during rapid imaging, these noises reach high levels.

One possibility for the reduction of the noise produced by the gradient coils to arrange noise-damping materials in the vicinity of the gradient coils, which materials absorb the acoustic energy and thereby reduce the production of noise. The noise-reducing effect improves as the mechanical tension or oscillations to which the damping material is exposed becomes higher. The precision of the generated gradient fields, however, is affected by oscillations of the gradient coils. A limit for sound-damping measures is thus that oscillations cannot persist at a level such that the precision of the gradient fields, and thereby the image quality, is affected.

Another measure for the reduction of noises disturbing to the patient is to compensate the noises by also supplying the patient with "compensating noise" formed from the primary noise phase-shifted 180°. This measure, however, has shown only limited success, because the modes of oscillation of the gradient coils are very complex, and for this reason the necessary 180° phase shift cannot be achieved for every mode of oscillation.

SUMMARY OF THE INVENTION

An object of the present invention is to provide a nuclear magnetic resonance apparatus in which the noise burden for the patient resulting from the operation of the gradient coils is diminished without affecting the precision of the gradient fields.

This object is achieved in a magnetic resonance imaging apparatus constructed in accordance with the principles of the present invention wherein means for reduction of the main magnetic field present in an environment of the conductors are allocated to the conductors. The reduction of the main magnetic field at the conductors of the gradient coils, oriented essentially perpendicularly to the main magnetic field, has the effect that the Lorentz forces that appear during switching are reduced to the same extent. Correspondingly, the vibrations of the gradient coils are reduced at least in their amplitude and in the ideal case are eliminated. The noise problem is thus solved at its root, i.e. at the Lorentz forces affecting the gradient coil conductors.

DESCRIPTION OF THE PREFERRED EMBODIMENTS

Figure 1:
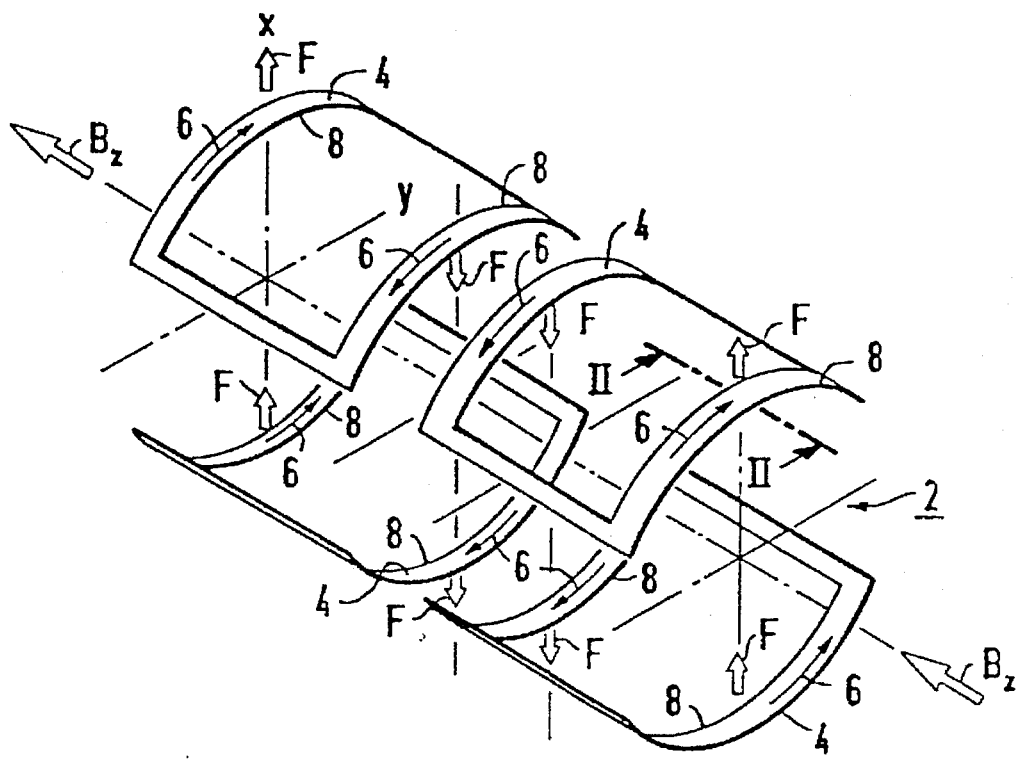
FIG. 1 shows, in a perspective view, the noise-producing elements of a typical nuclear magnetic resonance apparatus.

FIG. 1 shows the parts of a typical diagnostic nuclear magnetic resonance apparatus that are primarily responsible for producing operating noises. Further elements necessary for the operation of the nuclear magnetic resonance apparatus are readily available in many publications and are well-known to those of ordinary skill in this field, and for clarity these elements are not shown in FIG. 1. An essentially cylindrical examination chamber 2, formed in the version of FIG. 1 so as to completely accept a patient, is part of the nuclear magnetic resonance apparatus. A homogeneous main magnetic field $B_z$, generated by a superconducting magnet arrangement (not shown), extends in the axial direction of the examination chamber 2. The axial direction here is the direction of a z-axis of a Cartesian x-y-z coordinate system. Gradient coils for the generation of gradient fields along the three coordinate axes x, y, z are fastened to a carrier tube (not shown) in the form of a hollow cylindrical jacket, oriented coaxially with the examination chamber 2. Gradient coils 4 are shown in FIG. 1 which generate a gradient field in the x-direction. Gradient coils for the generation of a gradient field in the y-direction are built in the same way as the x-gradient coils 4, but however are rotated 90°. Gradient coils for generating a gradient field in the z-direction are essentially made of conductor loops oriented parallel to the x-y plane.

For the supply of the currents required for the generation of the gradient fields, the gradient coils are connected with gradient power supplies (not shown). Thus, the gradient power supply connected with the x-gradient coils 4 supplies the gradient coils 4 with currents in the direction of the arrows 6, or in the opposite direction.

The gradient coils include conductors 8, oriented perpendicularly to the direction of the main magnetic field $B_z$. Forces F operate on these conductors 8, these forces being produced by the currents 6 that flow in the conductors and the magnetic field $B_z$ present in the environment of the conductors 8. The forces F cause a displacement of the gradient coils, including the carrier tube. Given the relationships shown in FIG. 1, the carrier tube and the gradient coils are thus displaced downwardly in the middle and upwardly at the ends. Corresponding relationships exist for the y-gradients. The displacements change due to the switching of the gradient currents necessary for imaging. The consequences are vibrations and thus unpleasant noises.

Figure 2:
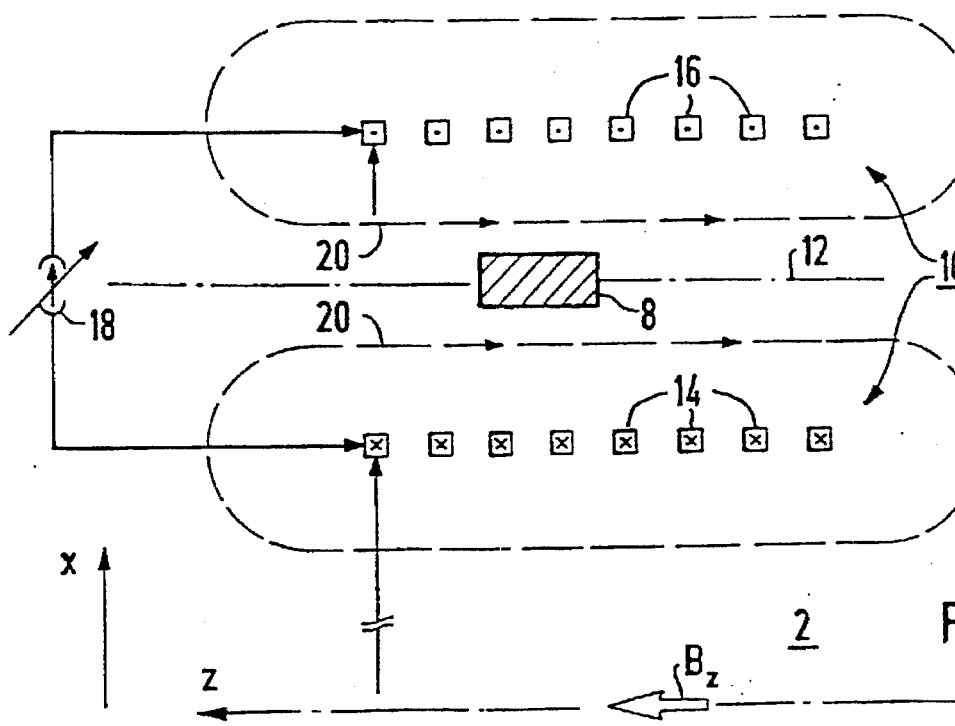
FIG. 2 illustrates the principle of the noise reduction employed in the apparatus of the invention in a section of the apparatus of FIG. 1 taken along line II—II.

The principle of the inventive reduction of the main magnetic field $B_z$ at the conductors 8 is now explained on the basis of FIG. 2. As an example, a conductor 8 is represented in cross-section, as results from taking the section designated II—II in FIG. 1. A coil arrangement 10 for the generation of an altered magnetic field includes inner windings 14, arranged toward the examination chamber 2 in relation to the conductor 8, and outer windings 16 arranged on the outside. The windings 14 and 16 are arranged in the direction of the circumference around the examination chamber 2 and thus are oriented perpendicularly to the main magnetic field $B_z$. The conductors 8 are located between the inner windings 14 and the outer windings 16. The windings 14 and 16 are connected to an adjustable DC power source 18, which supplies the windings 14 and 16 with a current, which generates a compensating magnetic field 20. This compensating magnetic field 20 alters the main magnetic field $B_z$ in the environment of the conductor 8 so as, to completely suppress the production of Lorentz forces by the main magnetic field in the ideal case. For this purpose, the current in the inner windings 14 flows away from the observer and in the outer windings 16 flows towards the observer, symbolized in FIG. 1 by crosses and dots respectively in the windings 14 and 16.

Figure 3:
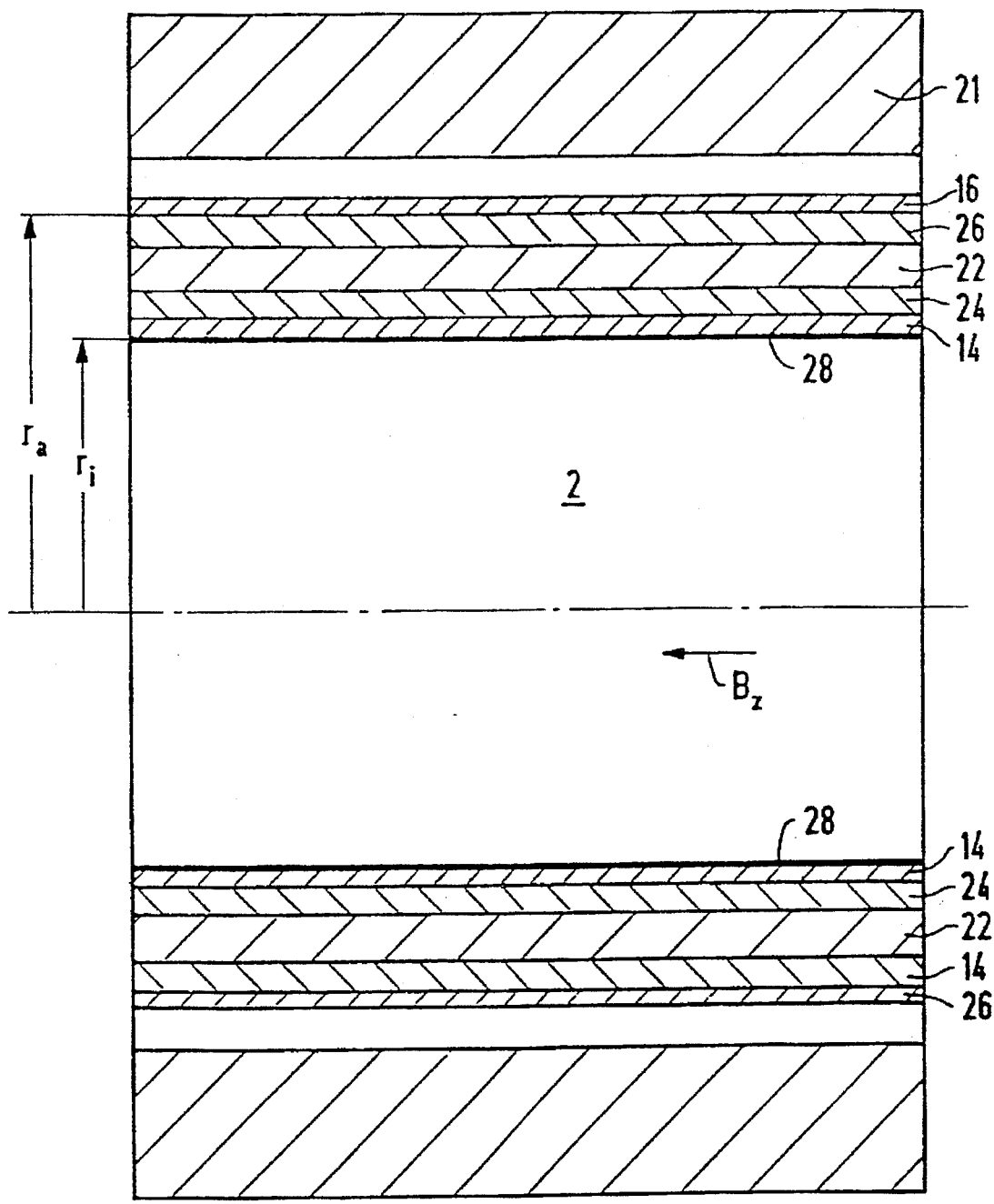
FIG. 3 shows, in a sectional view, the basic construction of a noise-reduced nuclear magnetic resonance apparatus in accordance with the invention.

FIG. 3 shows, in a sectional representation, the construction of a noise-reduced nuclear magnetic resonance apparatus. A carrier tube 22 is arranged inside a superconducting coil arrangement 21 for generating the main magnetic field $B_z$, the carrier tube surrounding the examination chamber 2 on a cylinder jacket surface. Internal primary gradient coils 24 are arranged toward the examination chamber 2, and external secondary gradient coils 26 are arranged away from the examination chamber 2, which compensate the outwardly directed scatter field of the primary gradient coils 24. This type of compensation of the gradient scatter field is also called active shielding, whereby eddy currents in external conductive parts, such as e.g. in the cryobasin of the superconducting magnet, are suppressed. The gradient coils 24 and 26 are cast to form a stable unit with the carrier tube 22. The inner windings 14 are arranged toward the examination chamber 2, and the outer windings 16 are arranged outside, both so as to be coaxial with the carrier tube 22 and with the gradient coils 24 and 26. The distance from the inner windings 14 to the outer windings 16 is so small that they have only a small influence on the linearity of the gradient fields and on the homogeneity of the basic field in the examination chamber 2. If warranted, the influence can be equalized through shimming measures.

It is not necessary to arrange the inner windings 14 and the outer windings 16 uniformly over the overall length of the examination chamber 2. Significant reductions in noise can already be achieved if the windings 14 and 16 alter the main magnetic field $B_z$ only in the area of the conductors 8, oriented perpendicular to the main magnetic field $B_z$.

The inner windings 14 and the outer windings 16 themselves also produce noises if the gradient currents are switched in the gradient coils 24 and 26. Such noises, however, are significantly less than those of the main magnetic field $B_z$ and those due to the gradient currents. In addition, they are easily damped since here, in contrast to the gradient coils 24 and 26, large vibrational amplitudes can be allowed without affecting the quality of the gradient fields. A sound-absorbing and/or sound-damping layer 28 arranged on the examination chamber 2 significantly reduces the noises produced by the coil arrangement 10.

Although modifications and changes may be suggested by those skilled in the art, it is the intention of the inventor to embody within the patent warranted hereon all changes and modifications as reasonably and properly come within the scope of his contribution to the art.

I claim as my invention:

1. A diagnostic nuclear magnetic resonance apparatus comprising:
    means for generating a main magnetic field having a main magnetic field direction;
    gradient coils for generating gradient fields, each gradient coil having respective conductors running substantially perpendicularly to said main magnetic field direction; and
    means, allocated to said conductors, for reducing said main magnetic field in an environment of said conductors for reducing noise produced by oscillation of said conductors.

2. A diagnostic nuclear magnetic resonance imaging apparatus as claimed in claim 1 wherein said means for reducing said main magnetic field comprise means for generating a further magnetic field which alters said main magnetic field in said environment of said conductors.

3. A diagnostic magnetic resonance imaging apparatus as claimed in claim 2 wherein said means for generating said further magnetic field comprise a coil arrangement with a d.c. power source connected thereto.

4. A diagnostic nuclear magnetic resonance imaging apparatus as claimed in claim 3 further comprising a hollow cylindrical jacket surrounding an examination chamber and having a jacket surface, said main magnetic field direction being along an axial direction of said jacket surface, said gradient coils being disposed on said jacket surface and said coil arrangement comprising winding disposed co-axially relative to said cylindrical jacket and running in a direction of the circumference of said cylindrical jacket.

5. A diagnostic nuclear magnetic resonance imaging apparatus as claimed in claim 4 wherein said windings of said coil arrangement include inner windings disposed on an inner side of said cylindrical jacket and outer windings disposed on an outer side of said cylindrical jacket, and said conductors of said gradient coils running substantially perpendicularly to said main magnetic field being disposed between said inner and outer windings.

6. A diagnostic nuclear magnetic resonance imaging apparatus as claimed in claim 1 wherein said gradient coils comprise primary gradient coils and secondary gradient coils, said secondary gradient coils comprising means for compensating for a scatter magnetic field generated outside an examination chamber by said primary gradient coils.

7. A diagnostic nuclear magnetic resonance imaging apparatus as claimed in claim 1 wherein said means for generating said main magnetic field comprise a superconducting coil arrangement.

8. A diagnostic nuclear magnetic resonance imaging apparatus as claimed in claim 1 further comprising sound-absorbing materials spatially allocated to said means for reducing said main magnetic field.

9. A diagnostic nuclear magnetic resonance imaging apparatus as claimed in claim 1 further comprising sound-damping materials spatially allocated to said means for reducing said main magnetic field.

10. A diagnostic nuclear magnetic resonance apparatus comprising:

means for generating a main magnetic field having a main magnetic field direction;

gradient coils for generating gradient fields, each gradient coil having respective conductors running substantially perpendicularly to said main magnetic field direction; and means, allocated to said conductors, for altering said main magnetic field in an environment of said conductors for substantially suppressing production of Lorentz forces acting on said conductors by said main magnetic field.

* * * * *